United States Patent

Hashimoto et al.

[11] Patent Number: 5,913,139
[45] Date of Patent: Jun. 15, 1999

[54] METHOD OF MANUFACTURING A SEMICONDUCTOR DEVICE WITH LOCAL INTERCONNECT OF METAL SILICIDE

[75] Inventors: Koichi Hashimoto; Hiromi Hayashi, both of Kawasaki, Japan

[73] Assignee: Fujitsu Limited, Kanagawa, Japan

[21] Appl. No.: 08/907,637

[22] Filed: Aug. 8, 1997

[30] Foreign Application Priority Data

Dec. 26, 1996 [JP] Japan .................................. 8-349087

[51] Int. Cl.⁶ .................................................. H01L 21/28
[52] U.S. Cl. ...................... 438/618; 438/621; 438/649; 438/655; 438/683
[58] Field of Search .................................... 438/586, 592, 438/618, 621, 649, 655, 656, 682, 683; 257/384, 412, 413

[56] References Cited

U.S. PATENT DOCUMENTS

| | | | |
|---|---|---|---|
| 4,384,301 | 5/1983 | Tasch, Jr., et al. | 257/327 |
| 4,545,116 | 10/1985 | Lau | 438/647 |
| 4,793,896 | 12/1988 | Douglas | 438/630 |
| 4,804,636 | 2/1989 | Groover, III et al. | 438/275 |
| 4,821,085 | 4/1989 | Haken et al. | 257/412 |
| 4,975,756 | 12/1990 | Haken et al. | 257/371 |
| 5,346,860 | 9/1994 | Wei | 438/655 |
| 5,387,535 | 2/1995 | Wilmsmeyer | 438/655 |
| 5,403,759 | 4/1995 | Havemann | 257/69 |
| 5,418,398 | 5/1995 | Sardella et al. | 257/755 |
| 5,443,996 | 8/1995 | Lee et al. | 438/586 |
| 5,635,426 | 6/1997 | Hayashi et al. | 438/453 |
| 5,654,575 | 8/1997 | Jeng | 257/384 |

FOREIGN PATENT DOCUMENTS 3-234062  10/1991  Japan .

OTHER PUBLICATIONS

Murarka, S., et al., "Self–Aligned Cobalt Disilicide for Gate and Interconnection and Contacts to Shallow Junctions", IEEE Trans. Electron Devices, vol. ED–34, No. 10, Oct. 1987, pp. 2108–2115.

van Houtum, H., et al., "TiSi2 strp formation by Ti–amorphous–Si reaction ", J. Vac. Sci. Technol. B 6(6), Nov./Dec. 1988, pp. 1734–1739.

Bos., A., et al., "Formation of TiSi2 form Titanium and amorphous silicon layers for Local interconnection technology", Thin Solid Films, vol. 197, Nos. 1–2, Mar. 1991, pp. 169–178.

*Primary Examiner*—T. N. Quach
*Attorney, Agent, or Firm*—Armstrong, Westerman, Hattori, McLeland & Naughton

[57] ABSTRACT

A first metal silicide film is formed on an exposed silicon region of a substrate on which the silicon region and an insulating region are exposed. A metal film is deposited over the whole surface of the substrate covering the first metal silicide film, the metal film capable of being silicidized. A silicon film is deposited on the surface of the metal film. The silicon film and metal film are patterned to form a lamination pattern of the silicon film and metal film continuously extending from a partial area of the exposed silicon region to a partial area of the insulating region. The lamination pattern is heated to establish a silicidation reaction and form a second metal silicide layer.

8 Claims, 9 Drawing Sheets

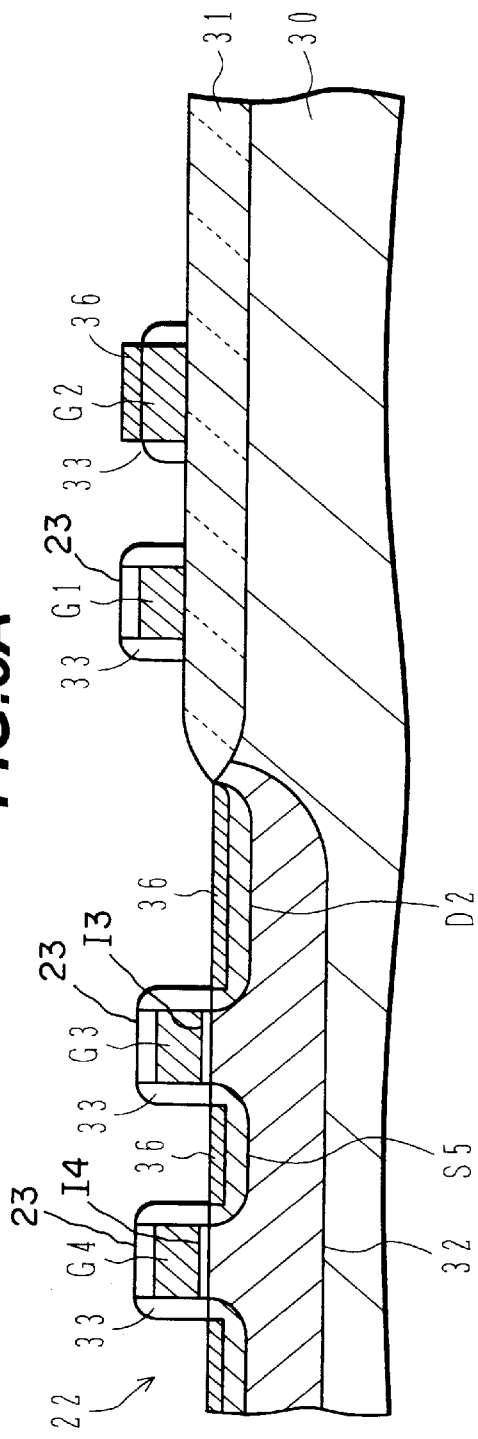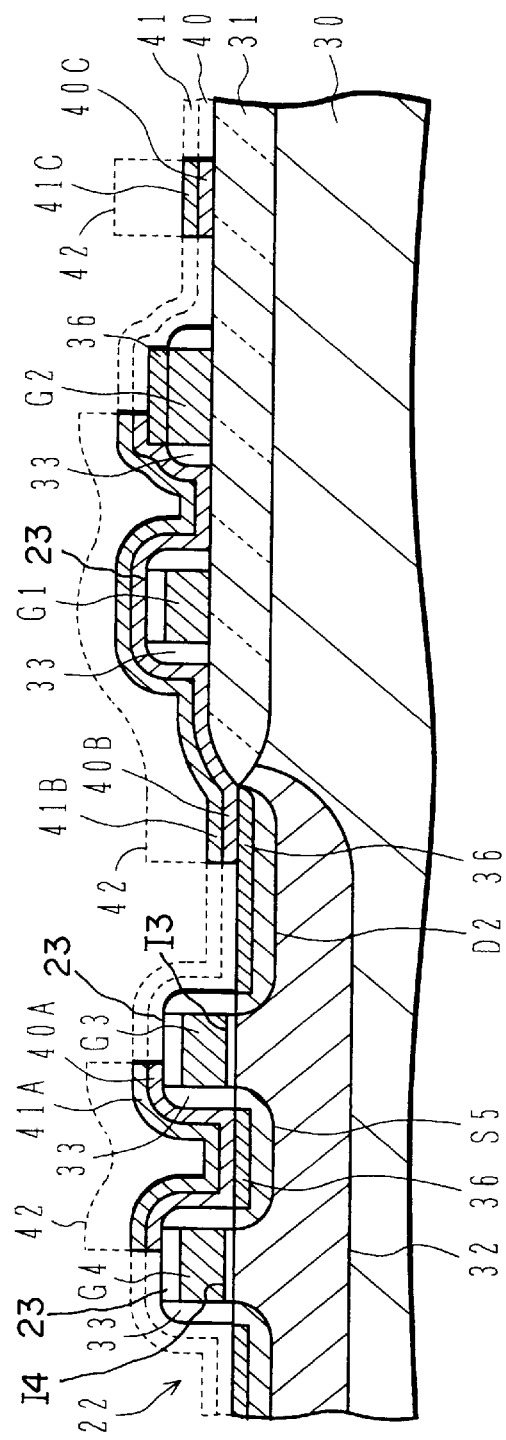

METHOD OF MANUFACTURING A SEMICONDUCTOR DEVICE WITH LOCAL INTERCONNECT OF METAL SILICIDE

This application is based on Japanese Patent Application Hei 8-349087 filed on Dec. 26, 1996, the entire contents of which are incorporated herein by reference.

BACKGROUND OF THE INVENTION a) Field of the Invention

The present invention relates to a method of manufacturing silicon semiconductor devices, and more particularly to a method of manufacturing semiconductor devices having silicide interconnects.

b) Description of the Related Art

Generally, in order to connect a conductive pattern formed on the surface of a semiconductor substrate to another contact area, the conductive pattern is covered with an insulating film and after a contact hole is formed through this insulating film, a wiring pattern is formed. Wiring for the connection between circuits or nodes at very short distances is called a local interconnect.

A local interconnect between a wiring pattern formed on a field oxide film and a diffusion region on the substrate surface can be formed without a process of forming an interlayer insulating film and a process of forming a contact hole. It is therefore very desirable from the viewpoint of forming micro semiconductor devices and simplifying processes.

FIGS. 9A to 9D are cross sectional views of a semiconductor substrate illustrating a method of forming local interconnects using self-aligned silicide (salicide) techniques disclosed in U.S. Pat. No. 4,873,204.

As shown in FIG. 9A, on the surface of a silicon substrate 100 a field oxide film 101 is formed which defines active regions 102A and 102B. In the active region 102A a MOSFET is formed having a source region 103AS, a drain region 103AD and a gate electrode 104A, and in the active region 102B another MOSFET is formed having a source region 103BS, a drain region 103BD and a gate electrode 104B. On the side walls of the gate electrodes 104A and 104B, side wall insulators 105A and 105B are formed. The gate electrodes 104A and 104B are extended in the direction vertical to the drawing sheet and formed also on the field oxide film.

A silicon wiring pattern 104C is formed on the field oxide film 101 at the left side of FIG. 9A and side wall insulators 105C are formed on the side walls thereof.

A titanium film 106 is deposited covering the whole surface of the substrate, and an amorphous silicon film 107 is formed on the titanium film 106.

As shown in FIG. 9B, the silicon film 107 is partially etched to form amorphous silicon patterns 107A and 107B. The silicon pattern 107A extends from the upper surface of the source region 103AS and over the field oxide film 101 to the upper surface of the silicon wiring pattern 104C. The silicon pattern 107B extends from the upper surface of the drain region 103AD and over the field oxide film 101 to the upper surface of the source region 103BS.

After the silicon oxide film 107 is patterned, the substrate 100 is heated.

As shown in FIG. 9C, the titanium film 106 and the silicon surface in contact with titanium are subject to silicidation reaction so that a silicide layer is formed. The silicon patterns 107A and 107B react with the titanium film 106 to form silicide layers 108A and 108B.

The upper surfaces of the silicon pattern 104C and gate electrodes 104A and 104B react with the titanium film 106 and are silicidized. The surfaces of the source regions 103AS and 103BS and drain regions 103AD and 103BD also react with the titanium film 106 and are silicidized.

As shown in FIG. 9D, an interlayer insulating film 109 is deposited on the whole surface of the substrate. A contact hole is formed through the interlayer insulating film 109 to expose the surface of the silicide layer 108B, and a metal wiring pattern 110 is formed.

With the local interconnect forming method illustrated in FIGS. 9A to 9D, semiconductor active regions in the surface layer of the silicon substrate can be connected to other contact areas without using contact holes. This method is therefore effective for making semiconductor integrated circuits highly dense.

With this conventional local interconnect forming method, at the process shown in FIG. 9B the regions, where the silicon patterns 107A and 107B are formed, are covered with a resist pattern to selectively etch the silicon film 107. After this etching, the resist pattern used as the mask is removed by ashing with plasma or by dissolution with acid-containing etchant.

During the resist removing process, the titanium film 106 is in an exposed state at the region not covered with the resist pattern. Therefore, the exposed titanium film 106 may be oxidized or sputtered and thinned by plasma. The damaged titanium film 106 may make the succeeding silicidation reaction be unable to form a silicide film of good quality and low resistance.

Although local interconnects using silicide techniques are very effective for forming micro semiconductor devices, it cannot be said that the techniques are sufficiently mature.

SUMMARY OF THE INVENTION

It is an object of the present invention to provide a method of manufacturing semiconductor devices which utilizes silicidation techniques and enables to form local interconnects having good properties.

According to one aspect of the present invention, there is provided a method of manufacturing a semiconductor device comprising the steps of: a) forming a first metal silicide film on an exposed silicon region of a substrate on which the silicon region and an insulating region are exposed; b) depositing a metal film over the whole surface of the substrate covering the first metal silicide film, the metal film capable of being silicidized; c) depositing a silicon film on the surface of the metal film; d) patterning the silicon film and the metal film to form a lamination pattern of the silicon film and the metal film continuously extending from a partial area of the silicon region on the substrate to a partial area of the insulating region; and e) heating the lamination pattern to establish a silicidation reaction and form a second metal silicide layer.

The underlying layer of the silicon film is the metal film. Therefore, by selecting proper etchant, the etching selectivity of the silicon pattern to the underlying metal film can be made large. The metal film exposed while the silicon film is patterned, is removed prior to the process of forming the second metal silicide film. Therefore, even if the metal film exposed during the patterning of the silicon film is decomposed or damaged, this damaged metal film does not affect the succeeding processes.

During the process of forming the second metal silicide film, the patterned metal film has always the silicon film formed thereon. Therefore, a silicidation reaction of the metal film with the upper silicon film is supposedly enhanced, whereas the silicidation reaction of the metal film with the substrate silicon region is supposedly suppressed because metal of the metal film is difficult to diffuse into the already formed first metal silicide film and enter the silicon region. Furthermore, silicidation reaction does not occur at the area where the metal film was removed before the heat treatment. Therefore, the first metal silicide is suppressed from being thickened during the process of forming the second metal silicide film. It is therefore possible to form a stable and thin metal silicide film on the surface of a silicon substrate.

According to another aspect of the invention, in the step a), a silicidation reaction is performed at a temperature of 600° C. or higher.

At the heat treatment temperature of 450 to 550° C., as compared to the silicidation reaction between the metal film and silicon film, the silicidation reaction at the interface between the first metal silicide film and underlying silicon region is hard to occur. Therefore, the first metal silicide film can be suppressed further from being thickened.

According to another aspect of the present invention, the silicon film deposited at step the c) has a thickness so that there is an unreacted upper layer portion of the silicon film even if the whole thickness of the metal film is silicidized at the step e) and the step e) leaves the unreacted upper layer portion on the second metal silicide.

Since excessive silicon is provided during the silicide reaction between the metal film and silicon film, the thickness of the first metal silicide film can be reliably prevented from being thickened even if the thickness of the silicon film is irregular.

According to another aspect of the present invention, the method further comprises the steps of: f) forming an interlayer insulating film over the whole surface of the substrate, the interlayer insulating film covering the second metal silicide film and the unreacted upper layer portion thereof; g) forming a contact hole through the interlayer insulating film to expose a partial surface area of the unreacted upper layer portion left on the second metal silicide film; h) removing the unreacted upper layer portion exposed at the bottom of the contact hole to expose a partial surface area of the second metal silicide film; and i) forming a wiring pattern in contact with the second metal silicide film exposed in the contact hole.

The unreacted silicon film serves as the etching stopper layer of the second metal silicide film while a contact hole is formed through the interlayer insulating film.

According to another aspect of the present invention, there is provided a semiconductor device comprising: a substrate having an insulating region and an exposed silicon region thereon; a first metal silicide film formed on the exposed silicon region of the substrate; and a second metal silicide film continuously extending from a partial surface area of the first metal silicide film to a partial area of the insulating region, wherein a total thickness of the first and second metal silicide films at an overlapped area is generally equal to the first metal silicide film at an area where the second metal silicide film is not formed and the second metal silicide on the insulating region.

The silicon region on the substrate surface is electrically connected via the first and second metal silicide films to another element formed on the substrate.

BRIEF DESCRIPTION OF THE DRAWINGS

FIGS. 4A, 4B, 5A, 5B, and 6 are cross sectional views of a substrate illustrating a method of manufacturing a semiconductor device according to another embodiment of the invention.

DETAILED DESCRIPTION OF THE PREFERRED EMBODIMENTS

With reference to FIGS. 1A to 1C and FIGS. 2A and 2B, a method of manufacturing a semiconductor device according to an embodiment of the invention will be described.

Figure 1A:
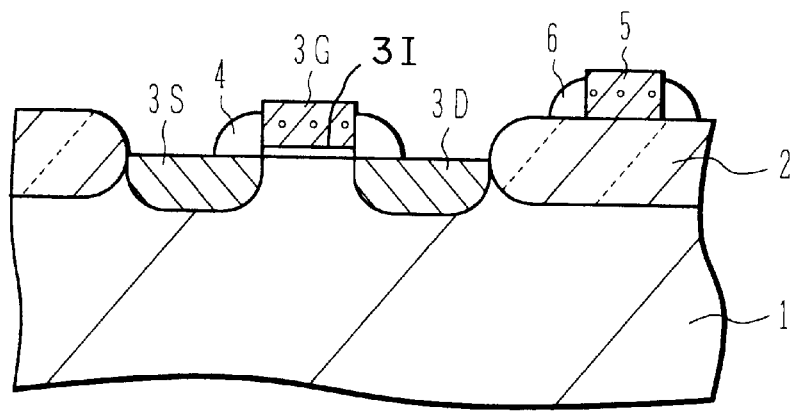
FIGS. 1A to 1C and FIGS. 2A and 2B are cross sectional views of a substrate illustrating a method of manufacturing a semiconductor device according to an embodiment of the invention.

As shown in FIG. 1A, an active region is defined by a field oxide film 2 formed on the surface of a silicon substrate 1. In this active region, a MOSFET is formed having a source region 3S, a drain region 3D agate oxide film 3I and a gate electrode 3G. The gate electrode 3G is placed on the gate oxide film 3I and is made of, for example, polysilicon. Side wall insulators 4 made of, for example, $SiO_2$, are formed on the side walls of the gate electrode 3G.

On the field oxide film 2 near MOSFET, a wiring pattern made of polysilicon is formed. This wiring pattern 5 is formed at the same time when the gate electrode 3G is formed. Side wall insulators 6 made of, for example, $SiO_2$, are also formed on the side walls of the wiring pattern 5.

Figure 1B:
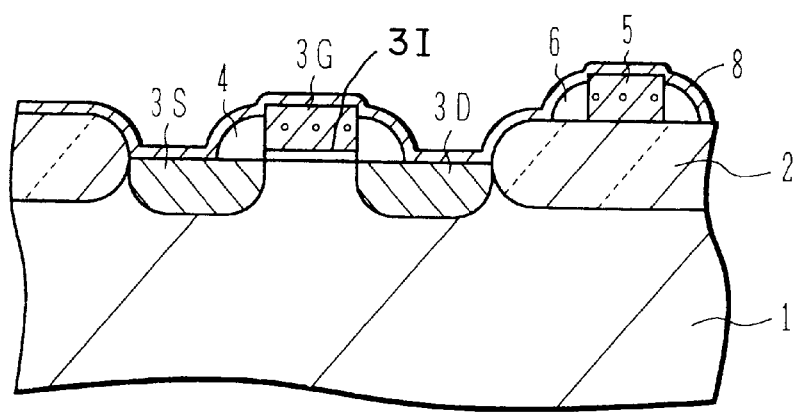

As shown in Fig. 1B, a cobalt (Co) film 8 is deposited on the substrate surface to a thickness of 8 nm by sputtering. A first heat treatment is performed for about 30 seconds at a temperature of 400 to 450° C. in an $N_2$ or Ar atmosphere to establish silicidation reaction between the source/drain regions 3S and 3D and the Co film 8. Next, the unreacted Co film is removed by a mixed solution of $H_2SO_4$, $H_2O_2$, and $H_2O$.

Figure 1C:
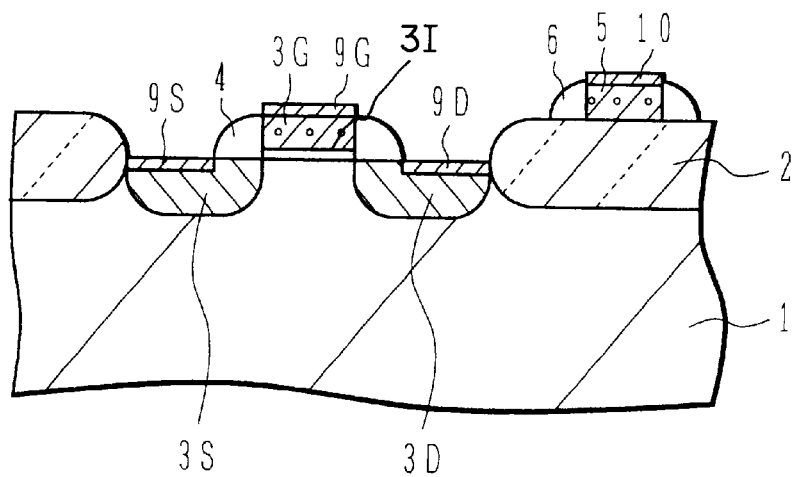

FIG. 1C shows the cross section after the unreacted Co film was removed. Co silicide ($Co_2Si$ or CoSi) films 9S, 9D, 9G, and 10 are formed on the upper surfaces of the source region 3S, drain region 3D, gate electrode 3G and wiring pattern 5. Prior to the heat treatment for silicidation reaction, a TiN film about 15 nm thick may be formed on the Co film 8. The TiN film prevents decomposition of the Co film 8 under the heat treatment. After the first heat treatment, this TiN film is removed by a mixed solution of $NH_3$, $H_2O_2$ and $H_2O$.

Next, a second heat treatment is performed for about 30 seconds at a temperature of 600 to 900° C. in an $N_2$ or Ar atmosphere to change the Co silicide films 9S, 9D, 9G and 10 to $CoSi_2$ having a lower resistance.

Figure 2A:
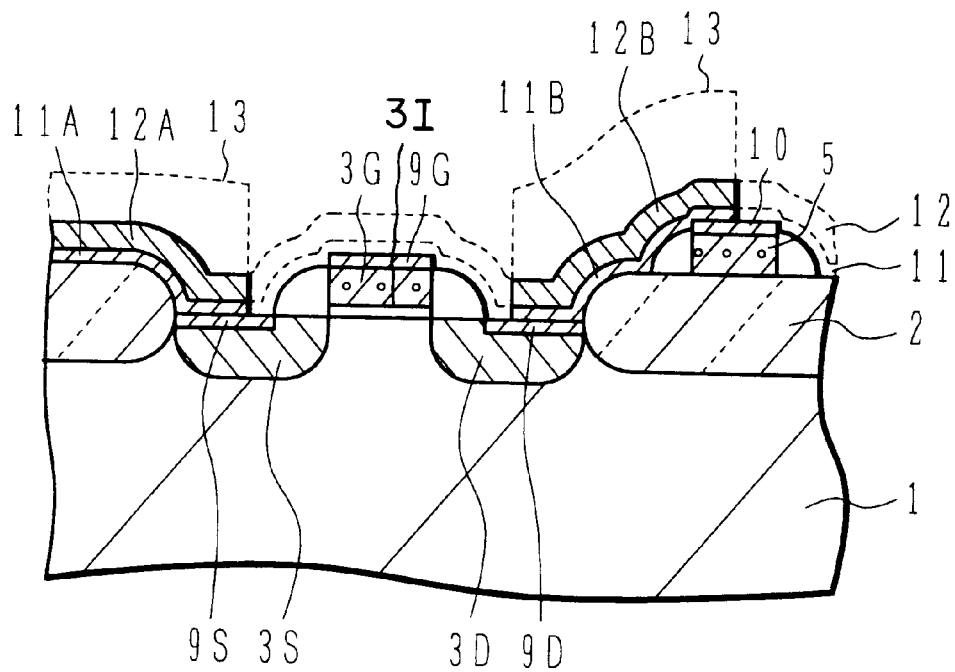

As shown in FIG. 2A, a Co film 11 about 8 nm thick is deposited on the substrate surface by sputtering. Next, an amorphous silicon film 12 about 30 nm thick is deposited by sputtering. The amorphous silicon film 12 is patterned by photolithography using a novolak resist mask 13 to form silicon patterns 12A and 12B. For example, dry etching using $SF_6$ gas may be used for etching the amorphous silicon film 12.

While the amorphous silicon film 12 is etched, the underlying layer of this silicon film 12 is the Co film 11. Therefore, by selecting proper etchant, an etching selectivity of the silicon film 12 to the underlying layer can be made large.

The silicon pattern 12A extends from the upper surface area of the source region 3S to the upper surface area of the nearby field oxide film 2. The silicon pattern 12B extends from the upper surface area of the drain region 3D and over the nearby field oxide film 2 to the upper surface of the wiring pattern 5.

After the amorphous silicon film 12 is patterned, the resist mask 13 is removed by ashing with oxygen plasma. This ashing oxidizes the surface of the Co film not covered with the silicon pattern 12A and 12B. Oxidation occurs only in the Co film 11 and does not occur in the underlying Co silicide films 9S, 9D and 10 and in the substrate 1.

The Co film 11 not covered with the silicon patterns 12A and 12B is removed by dilute nitric acid. Instead of dilute nitric acid, a mixed solution of HCl, $H_2O_2$ and $H_2O$ may be used. Co patterns 11A and 11B are left under the silicon patterns 12A and 12B. The Co film decomposed or oxidized during the patterning of the amorphous silicon film 12 and during the ashing of the resist mask 13 is also removed. Therefore, decomposition of the Co film does not affect the succeeding processes. Prior to the ashing, the Co film may be removed by a mixed solution of $H_2SO_4$, $H_2O_2$ and $H_2O$ or a mixed solution of $NH_3$, $H_2O_2$ and $H_2O$.

A heat treatment is performed at about 500° C. to establish silicidation reaction between the Co patterns 11A and 11B and the silicon patterns 12A and 12B.

Figure 2B:
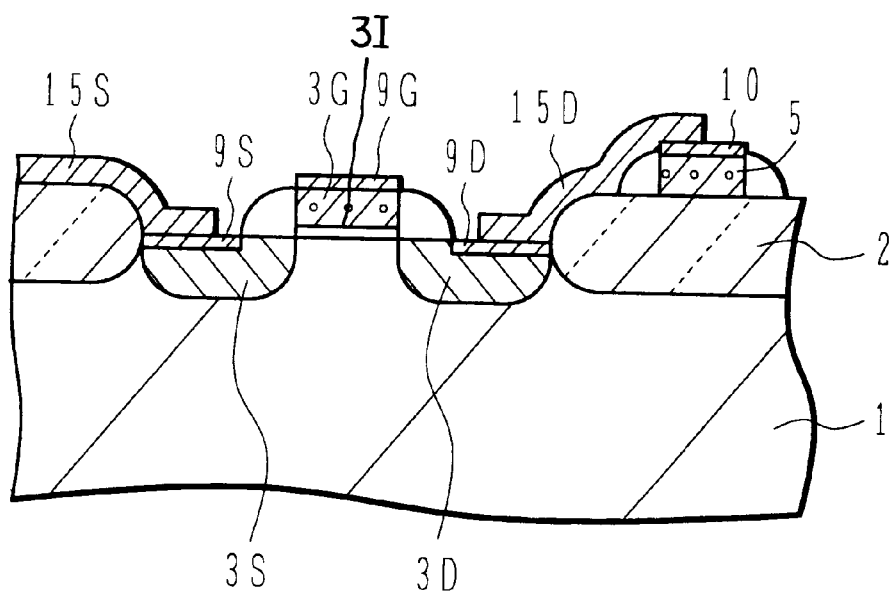

FIG. 2B shows the cross section of the substrate after the silicidation reaction. A Co silicide pattern 15S is formed which extends from the upper surface of the source region 3S to the upper surface of the nearby field oxide film 2, and another Co silicide pattern 15D is formed which extends from the upper surface of the drain region 3D to the upper surface of the wiring pattern 5. The drain region 3D and wiring pattern 5 are therefore electrically connected by the Co silicide pattern 15D.

In this embodiment, during the silicidation reaction after the Co film 1 shown in FIG. 2A is patterned, the Co patterns 11A and 11B always have the silicon patterns 12A and 12B formed thereon. It can be therefore supposed that there are an enhanced silicidation reaction between the Co patterns 11A and 11B and the upper silicon patterns 12A and 12B and a suppressed silicidation reaction at interfaces between the Co silicide films 9S and 9D and the lower silicon regions. Furthermore, there is no silicidation reaction at the region where the Co film 11 was removed before the heat treatment. It is therefore possible to prevent thickening the Co silicide films 9S and 9D. From this reason, the danger of increasing junction leak current can be alleviated which may be otherwise caused by the thickened Co silicide films 9S and 9D positioned nearer to the p-n junctions at the bottoms of the diffusion regions 3S and 3D.

If the silicidation reaction progresses toward the silicon substrate 1 side in the overlap region of the Co silicide film 9D and the Co silicide pattern 15D shown in FIG. 2B, Co in the Co pattern llB shown in FIG. 2A is consumed so that the Co silicide pattern 15D in this overlap region becomes thinner than that on the field oxide film 2. The total thickness of the Co silicide film 9D and Co silicide pattern 15D in the overlap region is therefore presumably nearly equal to the total thickness of the Co silicide film 9D in the region other than the overlap region and the Co silicide pattern 15D on the field oxide film 2.

In this embodiment, the local interconnect is formed by Co silicide. Silicide of other metals may be formed, for example, silicide of titanium, tungsten, platinum, chrome, and molybdenum.

Another embodiment will be described in which the local interconnect forming method of the above embodiment is applied to forming a static RAM. In this embodiment, although the local interconnect forming method is applied to a memory cell, it may be applied to a logic circuit.

Figure 3A:
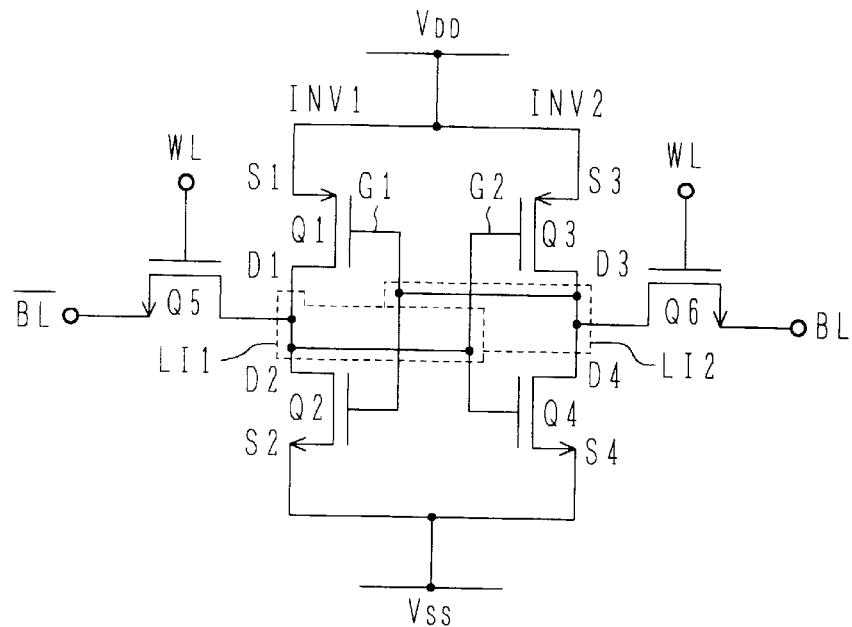
FIG. 3A is an equivalent circuit diagram of a static RAM manufactured by a semiconductor manufacturing method according to another embodiment of the invention.

FIG. 3A is an equivalent circuit of one-bit memory cell of a static RAM. Two inverter circuits INV1 and INV2 are connected between two power source lines $V_{DD}$ and $V_{SS}$. The first inverter circuit INV1 is constituted of a serial circuit of a p-MOS transistor Q1 and an n-MOS transistor Q2, and the second inverter circuit INV2 is constituted of a serial circuit of a p-MOS transistor Q3 and an n-MOS transistor Q4.

The drains D1 and D2 of the first inverter circuit INV1 are connected to the gate electrode G2 of the second inverter circuit INV2 via a local interconnect L11, and the drains D3 and D4 of the second inverter circuit INV2 are connected to the gate electrode G1 of the second inverter circuit INV1 via a local interconnect L12.

An output line of the first inverter circuit is connected via a transfer transistor Q5 to a bit line BL-bar, and an output line of the second inverter circuit INV2 is connected via a transfer transistor Q6 to a bit line BL. The gates of the two transfer transistors Q5 and Q6 are connected to the same word line WL.

Figure 3B:
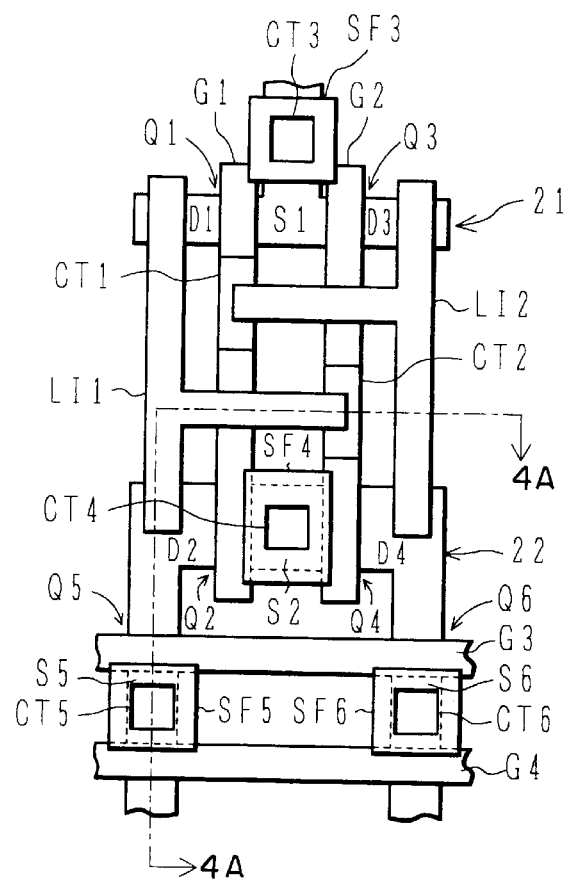
FIG. 3B is a plan view showing the layout of RAM formed on the substrate.

FIG. 3B is a plan view of the semiconductor device showing an example of the layout of the static RAM shown in FIG. 3A.

In FIG. 3B, an N-well is formed in the upper area, and a p-well is formed in the lower area. An active region 21 in the n-well is defined by a field oxide film, and an active region 22 in the p-well is defined by the field oxide film. The S1 surface at the area other than the active regions 21 and 22 is covered with the field oxide film.

The active region 21 in the n-well is of an inverted T-character shape, and the active region 22 in the p-well is of an inverted U-character shape. The two gate electrodes G1 and G2 are disposed extending between the horizontal portion of the inverted T-character shaped active region 21 and the horizontal portion of the inverted U-character shaped active region 22. The gate electrode G3 is disposed extending between the two vertical portions of the inverted U-character shaped active region 22 in the lower area of FIG. 3B. The gate electrode G3 functions also as the word line WL.

A gate electrode G4 is disposed parallel to the gate electrode G3 in the lower area of FIG. 3B below the gate electrode G3. The gate electrode G4 controls unrepresented memory cell transistors.

Using these gate electrodes G1, G2, G3 and G4 as an ion implantation mask, p-type impurity ions are doped in the surface layer of the active region 21 not covered with the gate electrodes G1 and G2 to form p-type regions, and n-type impurity ions are doped in the surface layer of the active region 22 not covered with the gate electrodes G1, G2, G3 and G4 to form n-type regions. In this manner, the two MOS transistors Q1 and Q3 are formed in the active region 21, the two MOS transistors Q2 and Q4 are formed in the active region 22 at the horizontal portion, and the two transistors Q5 and Q6 are formed in the active region 22 at the vertical portions.

In this structure, the source regions S1 of the MOS transistors Q1 and Q3 are made of the common region. The source regions S2 of the two MOS transistors Q2 and Q4 are also made of the common region. The drain regions D2 and D4 of the two MOS transistors Q5 and Q6 and the drain regions of the two MOS transistors Q2 and Q4 are made of the common regions.

The surfaces of the gate electrodes G1, G2, G3 and G4 are covered with an insulating film which is removed only at the area corresponding to contact areas CT1 and CT2. Namely, the gate electrodes are exposed only at the contact areas CT1 and CT2, and the substrate surface is exposed only at the active regions 21 and 22 not covered with the gate electrodes G1, G2, G3 and G4.

The gate electrode G1 at an area higher than the contact area CT1 on the MOS transistor Q1 side is given a p-type conductivity, and the gate electrode G1 at an area lower than the contact area CT1 on the MOS transistor Q2 side is given an n-type conductivity. Similarly, the gate electrode G2 at an area higher than the contact area CT2 on the MOS transistor Q3 side is given a p-type conductivity, and the gate electrode G2 at an area lower than the contact area CT2 on the MOS transistor Q4 side is given an n-type conductivity.

The local interconnects LI1 and LI2 are formed by the method described with FIGS. 1A to 2B. The local interconnect LI1 is formed interconnecting the drain regions D1 and D2 and the contact area CT2 of the gate electrode G2, and the local interconnect LI2 is formed interconnecting the drain regions D3 and D4 and the contact area CT1 of the gate electrode G1.

These local interconnects LI1 and LI2 are each in contact with the underlying semiconductor surfaces at three end portions, and are each disposed on the insulating layer at the other portions. Therefore, a specific interlayer insulating film is not necessary when the local interconnects LI1 and LI2 are formed.

An interlayer insulating film is formed on the local interconnects LI1 and LI2, and contact holes CT3, CT4, CT5 and CT6 are formed through the interlayer insulating film to expose the surfaces of the source regions S1, S2, S5 and S6. The bottoms of the contact holes CT3, CT4, CT5 and CT6 are silicide films SF3, SF4, SF5 and SF6 which were formed at the same time when the local interconnects LI1 and LI2 were formed. The bit lines BL-bar and BL connected via the contact holes CT5 and CT6 to the sources S5 and S8 of the transfer transistors Q5 and Q6 extend in the vertical direction on the interlayer insulating film. The power source lines $V_{DD}$ and $V_{ss}$ connected via the contact holes CT3 and CT4 to the sources of the transistors Q1 to S4 extend in the horizontal direction on the interlayer insulating film.

With reference to FIGS. 4A and 4B, FIGS. 5A and 5B and FIG. 6, a method of manufacturing the static RAM shown in FIGS. 3A and 3B will be described. The cross sections shown in FIGS. 4A to 6 correspond to those taken along one-dot chain line A—A shown in FIG. 3B.

Figure 4A:
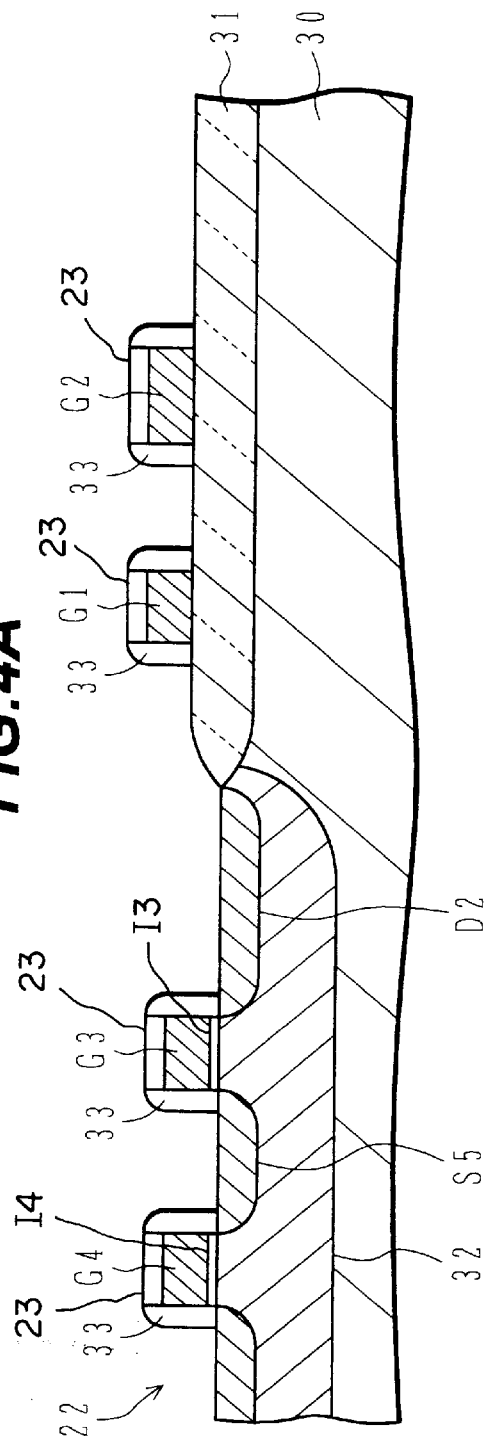

As shown in FIG. 4A, the surface of a silicon substrate 30 is selectively oxidized by local oxidation of silicon (LOCOS) to form a field oxide film 31. For example, the field oxide film 31 having a thickness of 250 nm can be formed by oxidation for 6 hours at a substrate temperature of 950° C. in a wet oxygen atmosphere. An active region 22 is defined by the field oxide film 31. P-type impurity ions are doped in the surface layer of the active region 22 to form a p-well 32. If necessary, a channel stopper region and a threshold value controlling impurity region (both not shown) are formed.

On the surface of the active region 22, gate electrodes G3 and G4 are formed on gate oxide films 13 and 14, and at the same time, wiring patterns G1 and G2 are formed on the surface of the field oxide film 31. The wiring patterns G1 and G2 correspond to the gate electrodes G1 and G2 shown in FIG. 3B. The processes of forming these gate electrodes will be detailed.

For example, the gate oxide film about 6 nm thick is formed on the surface of the active region 22 by oxidation for 10 minutes at a substrate temperature of 1000° C. in an atmosphere of dry oxygen diluted with argon.

For example, an amorphous silicon film is deposited to a thickness of about 200 nm on the substrate surface by chemical vapor deposition (CVD) at a growth temperature of 650° C. $P^+$ ions are implanted in the amorphous silicon film at the area corresponding to the gate electrodes G1, G3 and G4 in the p-well to impart n-type conductivity. Impurity ions are not doped in the amorphous silicon at the area corresponding to the gate electrode G2 in the p-well. Thereafter, $BF_2$ ions are implanted in the amorphous silicon film at the area corresponding to the gate electrodes of the p-channel MOS transistors Q1 and Q3 shown in FIG. 3B in the n-well to impart p-type conductivity.

An $SiO_2$ film is formed about 80 nm by CVD on the surface of the amorphous silicon film. This $SiO_2$ film is patterned to have a shape corresponding to the gate electrodes. Pattterned $SiO_2$ films 23 remain. By using the patterned $SiO_2$ films 23 as an etching mask, the amorphous silicon film and gate oxide film are patterned to form the gate electrodes G1 to G4. The amorphous silicon film may be etched by reactive ion etching (RIE) using HBr.

If necessary, n-type impurity ions are implanted in the surface layer of the p-well by using the gate electrodes G3 and G4 as a mask. In the surface layer of the n-well active region 21 shown in FIG. 3B, p-type impurity ions are implanted. These ion implantation processes are used for forming low concentration regions of the lightly doped drain (LDD) structure and may be omitted if the LDD structure is not used.

Next, side wall insulators 33 are formed on the side walls of the gate electrodes G1 to G4. The processes of forming the side wall insulators will be detailed.

A silicon oxide film about 100 nm thick is formed by CVD. This silicon oxide film is anisotropically etched through RIE by using as etchant a mixed gas of $CF_4$ and $CHF_3$. This anisotropic etching removes the silicon oxide film formed on the flat surface and leaves the side wall insulators 33 on the side walls of the gate electrodes G1 to G4.

By using as a mask the gate electrodes G3 and G4 and their side wall insulators 33, n-type impurity ions are implanted in the surface layer of the p-well. In the surface layer of the n-well in which the p-MOS transistors Q1 and Q3 shown in FIG. 3B, p-type impurity ions are implanted. Annealing is performed at a temperature of 800° C. to activate the ion implanted regions and form a source region S5 and a drain region D2. For example, As ions are implanted under the conditions of an acceleration energy of 25 kev and a dose of $2=10^{15} cm^{-2}$, and then rapid thermal annealing is performed for 10 minutes at 800° C.

Figure 4B:
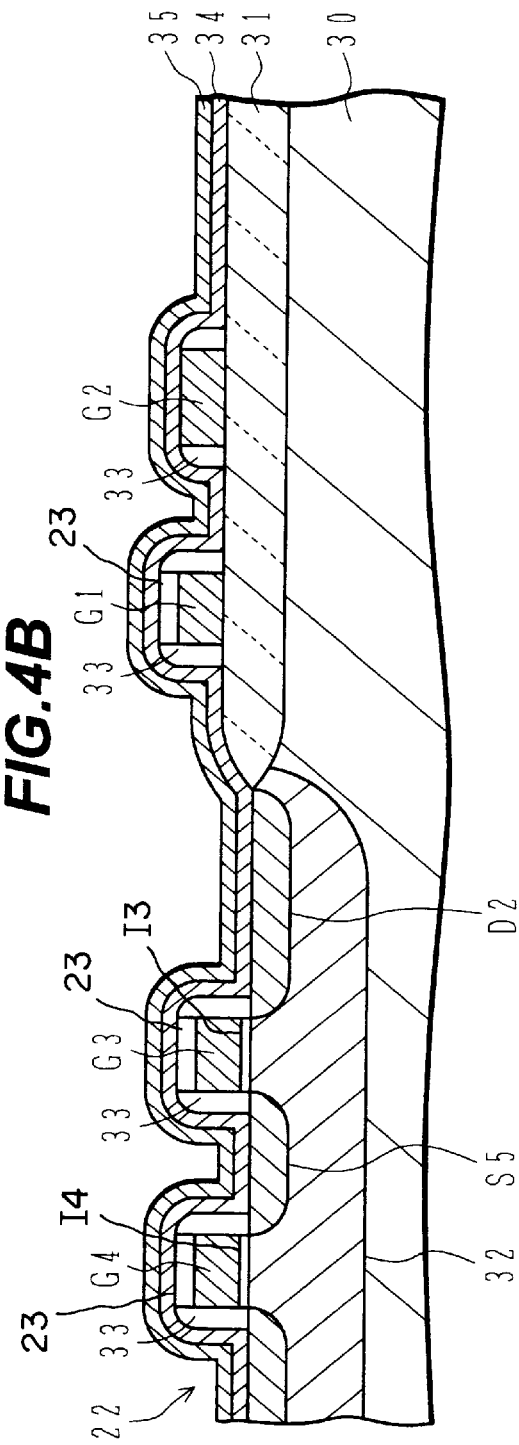

As shown in FIG. 4B, the $SiO_2$ on the gate electrode G2 (in FIG. 3B, in an area near the connection area between the gate electrode G2 and the local interconnect LI1) is removed and a cobalt (Co) film 34 is formed to a thickness of 8 nm on the substrate surface. For example, the Co film 34 is formed through RF sputtering by using Ar gas at a flow rate of 100 sccm as the sputtering gas and Co metal as the target under the conditions of a pressure of about 0.1 Pa and an RF input power of about 3.7 W/cm$^2$.

Next, a TiN film 35 about 15 nm thick is formed. For example, this TiN film is formed through reactive sputtering by using Ti metal as the target and a mixed gas of Ar and $N_2$ as the sputtering gas.

Heat treatment is performed for 30 seconds at a temperature of 400 to 450° C. in an $N_2$ or Ar atmosphere to establish silicidation reaction between the Co film 34 and silicon in contact with this film. The TiN film 35 prevents decomposition of the Co film 34 during the heat treatment. After the silicidation reaction, the TiN film 35 is removed by a mixed solution of $NH_3$, $H_2O_2$ and $H_2O$, and then the unreacted Co film 34 is removed by a mixed solution of $H_2SO_4$, $H_2O_2$ and $H_2O$.

FIG. 5A is a cross sectional view of the substrate after the TiN film 35 was removed. Co silicide ($Co_2Si$ or CoSi) films 36 are left on the surfaces of the gate electrode G2 and the source region S5 and drain region D2.

Another heat treatment is performed for 30 seconds at a temperature of 600 to 900° C. in an $N_2$ or Ar atmosphere. The Co silicide film 36 changes from $Co_2Si$ or CoSi to $CoSi_2$ of low resistance.

As shown in FIG. 5B, a Co film 40 is deposited to a thickness of 8 nm on the substrate surface. Next, an amorphous silicon film about 30 nm thick is deposited. This amorphous silicon film 41 is patterned by photolithography using a novolak resist mask 42 to form silicon patterns 41A, 41B and 41C.

For example, the silicon film 41 is etched by using a parallel plate RIE system. Etching without leaving the silicon film at a surface step was possible under the conditions of a $SF_6$ gas flow rate of 200 sccm, a pressure of 0.2 Torr and an applied RF power of 300 W.

The silicon pattern 41A corresponds to the Co silicide film SF5 shown in FIG. 3B and covers the surface of the source region S5 and the partial surfaces of the gate electrodes G3 and G4. The silicon pattern 41B corresponds to the local interconnect LI1 shown in FIG. 3B and extends from the partial area of the drain region D2 and over the gate electrode G1 to the upper surface of the gate electrode G2. The silicon pattern 41C corresponds to the local interconnect LI2 shown in FIG. 3B and is formed on the surface of the field oxide film 31.

After the amorphous silicon film 41 is patterned, the resist mask 42 is removed by ashing. For example, this ashing is performed by oxygen plasma generated in a barrel type plasma asher under the conditions of a chamber inner pressure of about 1 Torr and an RF power of 1 kw.

With the ashing under the above conditions, the surface of the Co film 40 not covered with the silicon patterns 41A, 41B and 41C is oxidized. This oxidation is only in the Co film and the underlying Co silicide layer 36 and silicon substrate 1 are not damaged.

The Co film 40 not covered with the silicon patterns 41A, 41B and 41C is removed by dilute sulfuric acid. Therefore, Co patterns 40A to 40C are left under the silicon patterns 41A to 41C. Since the Co film decomposed or oxidized during the patterning of the silicon film 41 and during the ashing of the resist pattern 42 is removed, decomposition of the Co film 40 does not affect the succeeding processes.

Heat treatment for 20 minutes at a temperature of 500° C. is performed to react the Co patterns 40A to 40C and the silicon patterns 41A to 41C to silicify the former.

Figure 6:
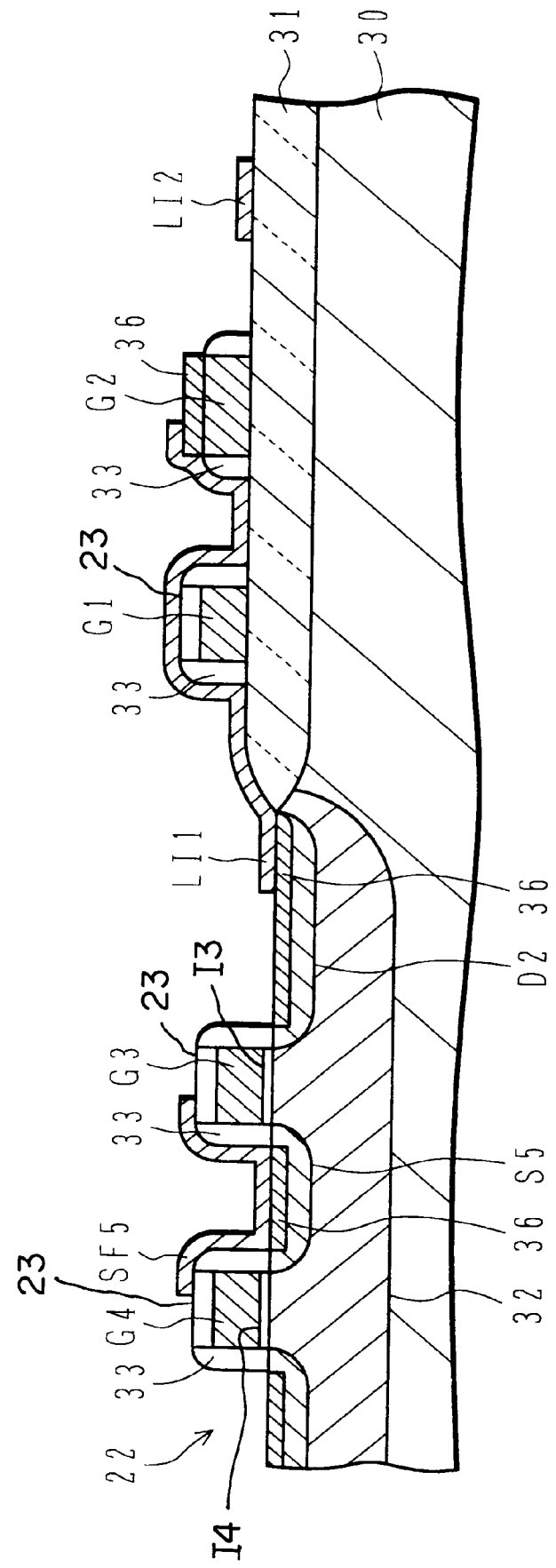

FIG. 6 is a cross sectional view of the substrate after the silicidation process. As shown, the substrate is formed with a Co silicide film SF5, a local interconnect LI1 interconnecting the drain region D2 and gate electrode G2, and a local interconnect LI2.

Next, similar to ordinary LSI manufacture processes, an interlayer insulating film is deposited by CVD and contact holes are formed to form a metal wiring layer.

In this embodiment, during the silicidation reaction described with FIG. 5B, the Co patterns 11A and 11B always have the silicon patterns 40A to 40C formed thereon. Therefore, similar to the embodiment shown in FIGS. 2A and 2B, it is possible to suppress thickening the Co silicide film 36.

In the above embodiment, the heat treatment for the silicide reaction described with FIG. 5B is set to 500° C. The heat treatment temperature is preferably set to 450 to 550° C. With this temperature range, as compared to the silicidation reaction between the Co patterns 40A to 40C and silicon patterns 41A to 41C, the silicidation reaction at the interfaces between the Co silicide film 36 and the underlying silicon region is more difficult to occur. Therefore, thickening the Co silicide film 36 can be suppressed further.

In the above embodiment, the amorphous silicon film 41 is deposited about 30 nm thick at the process shown in FIG. 5B. With this thickness of about 30 nm of the amorphous silicon film 41, the silicon patterns 41A to 41C of the whole thickness are silicidized by the whole thickness of the underlying Co patterns 40A to 40C.

The thickness of the amorphous silicon film 41 may be set to 30 nm or more, for example, 40 nm or more to provide an excessive amount of silicon for the silicidation process. With the excessive amount of silicon, a silicon film is left on the Co silicide film SF5 and local interconnects LI1 and LI2 shown in FIG. 6 after the silicidation reaction. With the excessive amount of silicon, shortage of silicon during the silicidation reaction can be avoided even if the thickness of the silicon film 41 is irregular. Therefore, it is possible to prevent the silicidation reaction progresses toward the deep region of the silicon substrate.

In the above embodiment, after the gate electrodes G3 and G4 and the like are patterned at the process of FIG. 4A, the $SiO_2$ film on the gate electrode G2 is removed at the process of FIG. 4B. This $SiO_2$ film may be removed in a different way. For example, prior to patterning the gate electrodes G3 and G4, the $SiO_2$ film on the gate electrode G2, more precisely the $SiO_2$ film at the contact areas CT1 and CT2 shown in FIG. 3B, may be removed.

Figure 7:
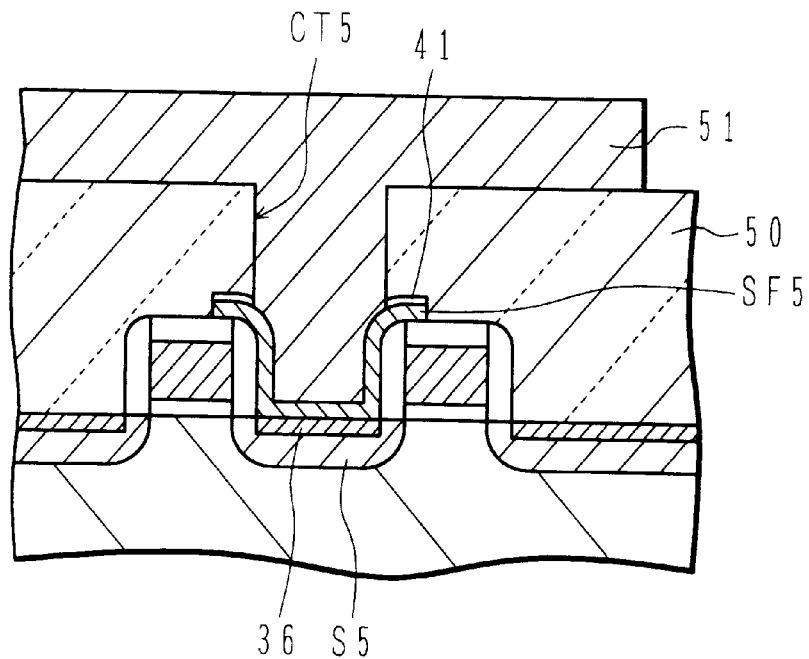
FIGS. 7 and 8 are cross sectional views of interlayer contact areas of semiconductor devices manufactured by semiconductor manufacturing methods according to modifications of the embodiment of the invention.

FIG. 7 is a cross sectional view of the interlayer contact area of the source region S5 with a silicon film being left on the Co silicide film SF5. After the processes illustrated in FIG. 6, an interlayer insulating film 50 is deposited on the substrate surface. A contact hole CT5 is formed through the interlayer insulating film 50 at an area corresponding to the source region S5. The silicon film 41 exposed on the lower surface of the contact hole CT5 is removed to expose the Co silicide film SF5 at the bottom of the contact hole CT5. A wiring layer 51 is formed filling the inside of the contact hole CT5.

Even if the etching selectivity of the interlayer insulating film 50 to the Co silicide film SF5 is insufficient, the silicon film 41 left on the Co silicide film SF5 functions as a damper film so that the Co silicide film SF5 can be protected from damages.

In this embodiment, the source region S5 and the upper wiring pattern 51 are connected via the Co silicide film SF5 as shown in FIG. 7. The upper wiring pattern may be directly connected to the source region S5 without using the Co silicide film SF5.

Figure 8:
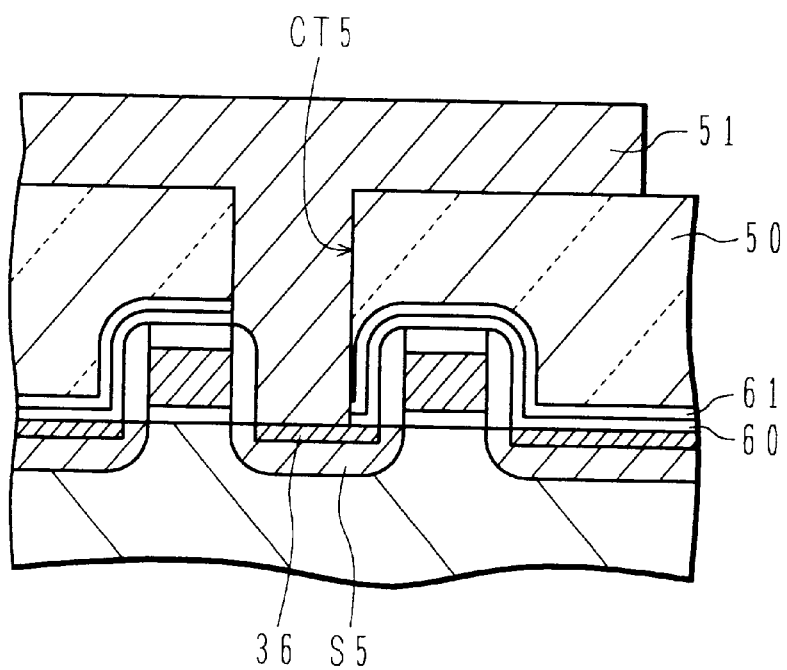
Figure 9A:
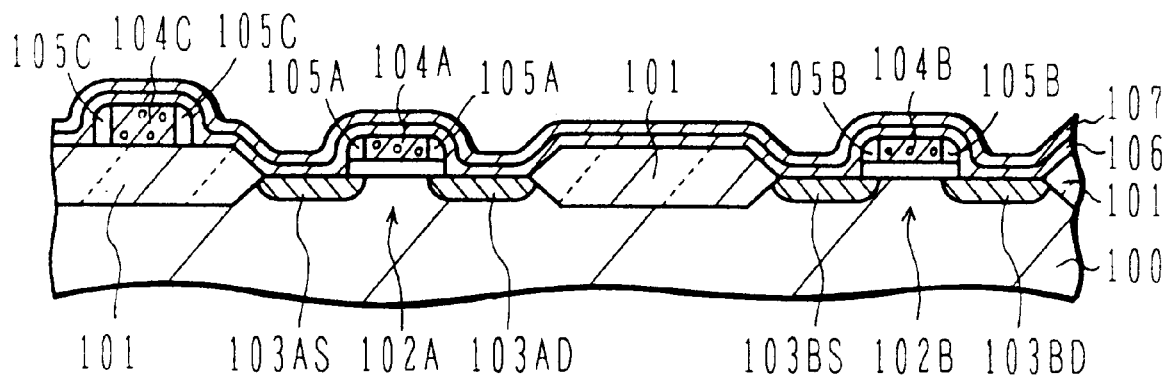
FIGS. 9A to 9D are cross sectional views of a substrate illustrating a conventional method of manufacturing a semiconductor device.
Figure 9B:
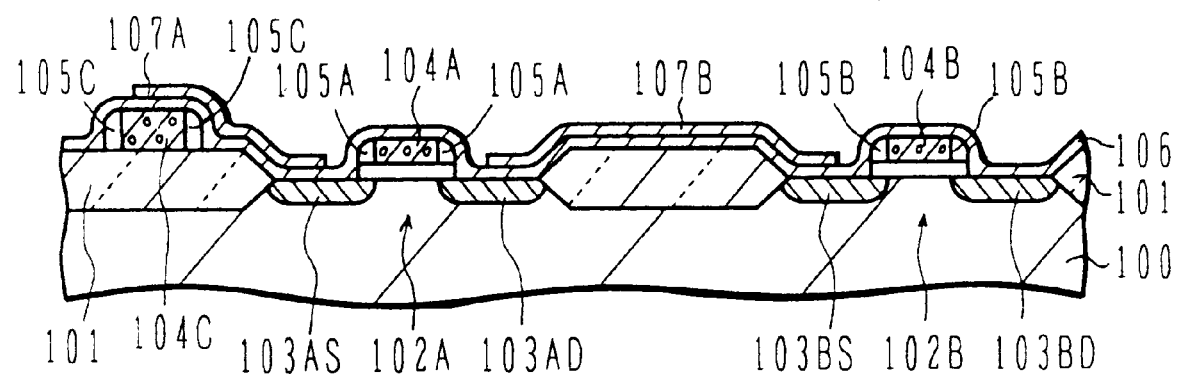
Figure 9C:
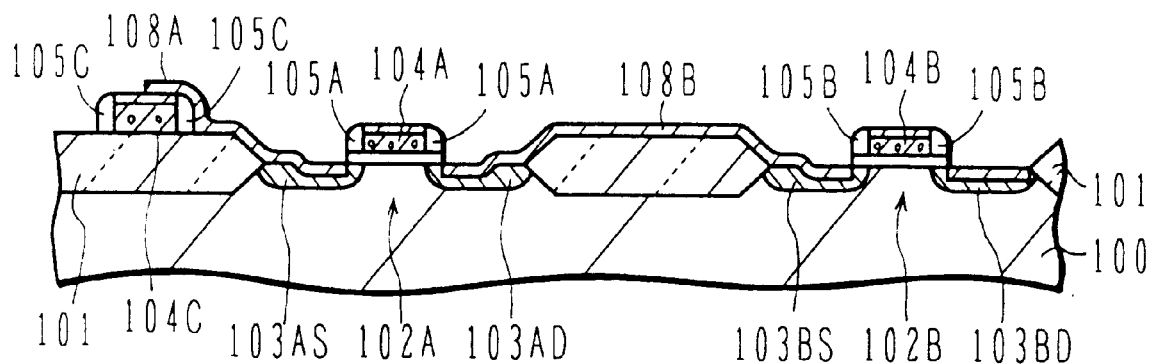
Figure 9D:
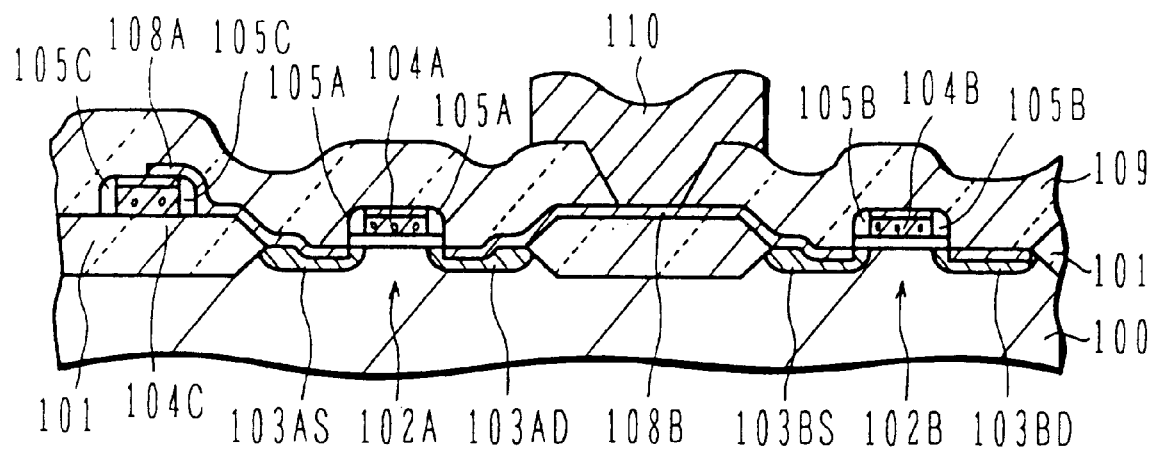

FIG. 8 is a cross sectional view of a contact area of the upper wiring pattern 51 directly connected to the source region S5. A method of forming this contact structure will be described.

At the embodiment process shown in FIG. 5B, the Co pattern 40A and the silicon pattern 41A at the area corresponding to the source region S5 are not left unetched. At the embodiment process shown in FIG. 6, only the local interconnects LI1 and LI2 are formed and the Co silicide film SF5 is not formed.

As shown in FIG. 8, prior to depositing the interlayer insulating film 50, an $SiO_2$ film with a 20 nm thickness and an SiN film 61 with a 70 nm thickness are sequentially stacked. The interlayer insulating film 50 is formed on the SiN film 61. The $SiO_2$ film 60 is deposited by plasma enhanced CVD using a mixed gas of $SiH_4$, $N_2O$ and $N_2$ under the conditions of a pressure of 3 Torr and an RF power of 300 W. The SiN film 61 is deposited by plasma enhanced CVD using a mixed gas of $SiH_4$, $N_2$ and $NH_3$ under the conditions of a pressure of 5.5 Torr and an RF power of 240 W.

A contact hole CT5 is formed through the interlayer insulating film 50 at an area corresponding to the source region S5. For example, the interlayer insulating film 50 is selectively etched by dry etching using a mixed gas of $C_4F_8$ and Ar. This etching automatically stops when the surface of the SiN film 6 is exposed.

The SiN film 61 exposed at the bottom of the contact hole CT5 is removed by dry etching using a mixed gas of $SF_6$ and HBr. This etching automatically stops when the surface of the $SiO_2$ film is exposed. The $SiO_2$ film 60 exposed at the bottom of the contact hole CT5 is removed by dry etching using a mixed gas of $CF_4$ and $CHF_3$.

The SiN film 61 functions as the etching stopper layer while the interlayer insulating film 50 is selectively etched. The $SiO_2$ film 60 is very thin so that this film can be removed with good reproductivity without exposing the gate electrode. Even if the contact hole CT5 is miss-aligned and overlapped with one of the gate electrodes on both sides of the source region D5, the upper wiring layer can be formed without shortening to the gate electrode. It is not necessary to form the Co silicide film SF5 shown in FIG. 3B and also the Co silicide films SF3, SF4 and SF6. Therefore, the area occupied by one memory cell can be reduced. The $SiO_2$ film 60 is formed in order to prevent the Co silicide film 36 from being damaged during the etching of the SiN film 61.

The present invention has been described in connection with the preferred embodiments. The invention is not limited only to the above embodiments. For example, since the amorphous silicon film is changed to a polysilicon film during heat treatment after the deposition, the amorphous silicon film may be changed to a polysilicon film, or a polysilicon film may be formed at the initial stage.

We claim:

1. A method of manufacturing a semiconductor device comprising the steps of:

a) providing a substrate on which a silicon region and an insulating region are exposed, and forming a first metal silicide film on an exposed silicon region of the substrate on which the silicon region and the insulating region are exposed;

b) depositing a metal film over the whole surface of the substrate covering the first metal silicide film, the metal film capable of being silicidized;

c) depositing a silicon film on the surface of the metal film;

d) patterning the silicon film and the metal film to form a lamination pattern of the silicon film and the metal film continuously extending from a partial area of the silicon region on the substrate to a partial area of the insulating region; and e) heating the lamination pattern to establish a silicidation reaction and form a second metal silicide layer.

2. A method according to claim 1, wherein the metal film is made of cobalt.

3. A method according to claim 2, wherein in said step a), a silicidation reaction is performed at a temperature of 600° C. or higher.

4. A method according to claim 2, wherein in said step a), the first metal silicide film is made of cobalt disilicide ($CoSi_2$).

5. A method according to claim 2, wherein in said step e), a silicidation reaction is performed at a temperature of 450 to 550° C.

6. A method according to claim 1, wherein the silicon film deposited at said step c) has a thickness so that an unreacted upper layer portion of the silicon film remains subsequent to said step e).

7. A method according to claim 6, further comprising the steps of:

f) forming an interlayer insulating film over the whole surface of the substrate, the interlayer insulating film covering the second metal silicide film and the unreacted upper layer portion thereof;

g) forming a contact hole through the interlayer insulating film to expose a partial surface area of the unreacted upper layer portion left on the second metal silicide film;

h) removing the unreacted upper layer portion exposed at the bottom of the contact hole to expose a partial surface area of the second metal silicide film; and i) forming a wiring pattern in contact with the second metal silicide film exposed in the contact hole.

8. A method according to claim 1, wherein the insulating region of the substrate includes a field oxide film formed on the surface of the substrate, and the silicon region includes a source region and a drain region formed in an active region defined by the field oxide film.

* * * * *